United States Patent [19] [11] Patent Number: 5,053,873
Taniji [45] Date of Patent: Oct. 1, 1991

[54] SOLID STATE IMAGE PICKUP DEVICE CAPABLE OF PICKING UP AN IMAGE WITH A LONG TIME EXPOSURE AT A LOW NOISE

[75] Inventor: Yukio Taniji, Tokyo, Japan

[73] Assignee: NEC Corporation, Tokyo, Japan

[21] Appl. No.: 421,562

[22] Filed: Oct. 11, 1989

[30] Foreign Application Priority Data

Oct. 11, 1988 [JP] Japan ................. 63-255675

[51] Int. Cl.⁵ ............ H04N 5/335; H04N 3/14; H04N 3/15
[52] U.S. Cl. ........................ 358/213.29; 358/213.15; 358/213.16; 358/213.19
[58] Field of Search .......... 358/213.16, 221, 213.29, 358/213.15, 213.19; 372/97

[56] References Cited

U.S. PATENT DOCUMENTS

| | | | |
|---|---|---|---|
| 3,584,146 | 6/1971 | Cath et al. | 358/221 |
| 4,484,223 | 10/1984 | Tsunekawa | 358/213.16 |
| 4,556,912 | 12/1985 | Yamanaka et al. | 358/213.16 |
| 4,602,291 | 7/1986 | Temes | 358/213.19 |
| 4,635,116 | 1/1987 | Hirota et al. | 358/213.15 |
| 4,706,123 | 11/1987 | Chautemps | 358/213.29 |
| 4,783,702 | 11/1988 | Sone et al. | 358/213.19 |
| 4,816,916 | 1/1989 | Akiyama | 358/213.29 |
| 4,819,071 | 4/1989 | Nakamura | 358/213.16 |
| 4,884,142 | 11/1989 | Suzuki | 358/213.19 |
| 4,897,728 | 1/1990 | Yamada | 358/213.29 |

FOREIGN PATENT DOCUMENTS

| | | |
|---|---|---|
| 0333533 | 9/1989 | France . |
| 0164667 | 10/1982 | Japan . |
| 0023674 | 2/1984 | Japan . |
| 0257677 | 12/1985 | Japan . |
| 0053076 | 3/1987 | Japan . |
| 0141868 | 6/1987 | Japan . |
| 0164188 | 6/1989 | Japan . |
| 0302974 | 12/1989 | Japan . |

Primary Examiner—John K. Peng
Assistant Examiner—Jeffrey D. Murrell
Attorney, Agent, or Firm—Sughrue, Mion, Zinn, Macpeak & Seas

[57] ABSTRACT

An image pickup system for use as a stationary camera or the like utilizes a solid state image pickup device including a matrix of photoelectric conversion cells. A vertical transfer serial shift register is located adjacent each column of photoelectric conversion cells and is connected in parallel thereto. A first horizontal transfer serial shift register is coupled in parallel to the respective final stages of the vertical transfer serial shift registers. A second horizontal serial shift register is coupled in parallel to the respective first stages of the vertical serial shift registers. A feedback path is formed between an output of the first horizontal serial shift register and an input of the second horizontal serial shift register. A circuit is provided in the feedback path for subtracting a signal corresponding to the dark currents of the photoelectric conversion cells from the output signal of the first horizontal serial shift register; the corrected signal is then transmitted to the input of the second horizontal serial shift register.

4 Claims, 4 Drawing Sheets

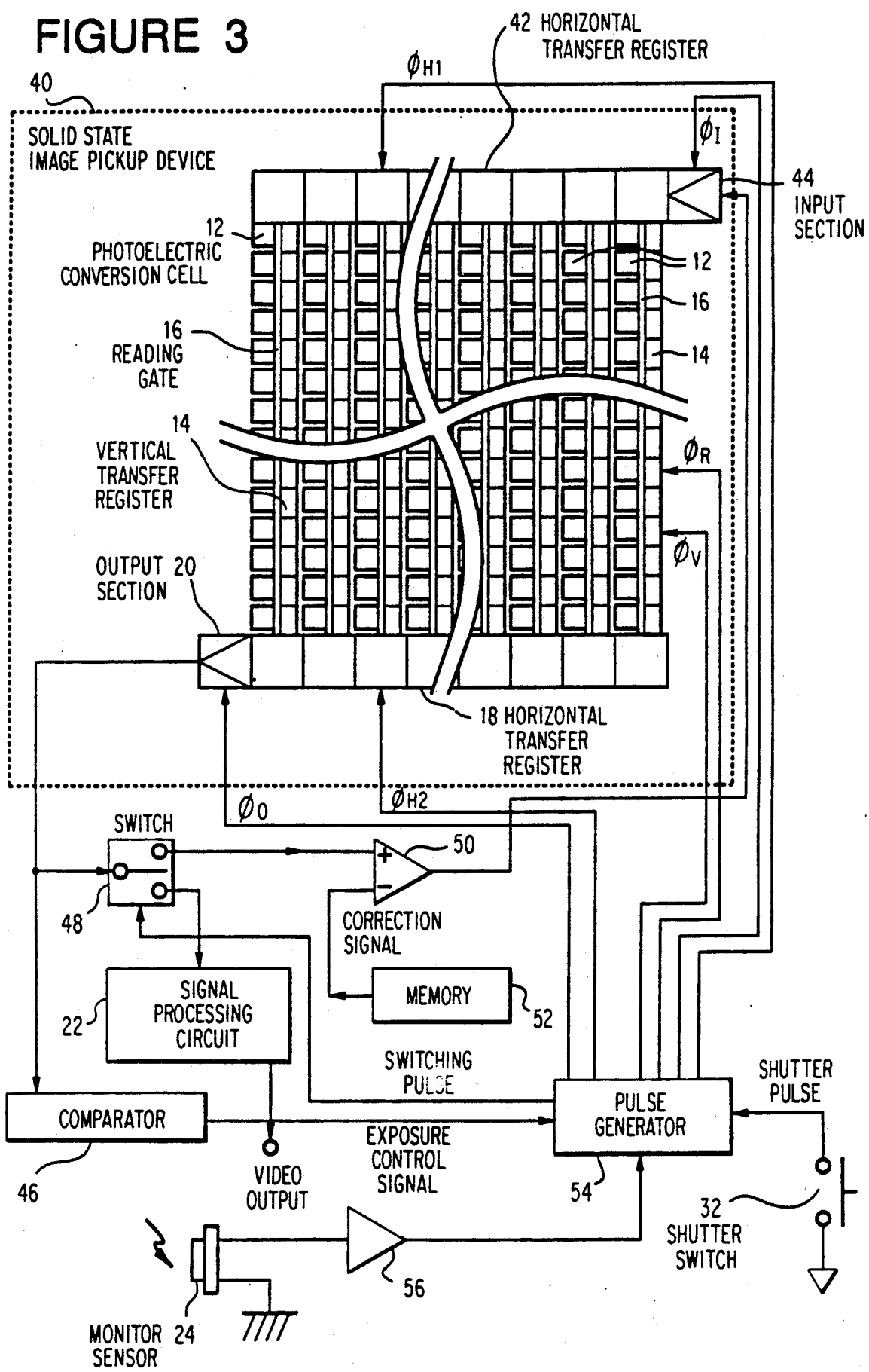

SOLID STATE IMAGE PICKUP DEVICE CAPABLE OF PICKING UP AN IMAGE WITH A LONG TIME EXPOSURE AT A LOW NOISE

BACKGROUND OF THE INVENTION

1. Field of the Invention

The present invention relates to a solid state image pickup device, and more specifically to a solid state image pickup system subjected to a decreased influence of a dark current in the case of a long time exposure.

2. Description of Related Art

Lately, solid state image pickup devices have been used not only in video cameras but also in electronic stationary image cameras. In the electronic stationary image cameras, the shutter speed is variable, unlike that in video cameras. In general, the shutter speed of the electronic stationary image cameras can be changed from several seconds to several ten thousandths of a second. However, since the electronic stationary image cameras do not have a saturation property as does photographic film, the electronic stationary image cameras have been utilized in a special applications requiring an extremely long time exposure time such as several tens of hours.

In general, a conventional solid state image pickup system is such that when the amount of incident light reaches a predetermined level, a reading signal is applied to a solid state image pickup device composed of a matrix of photoelectric conversion cells, so that light detection electric charge signals accumulated in the respective photoelectric conversion cells are sequentially and serially read out from the solid state image pickup device.

In the solid state image pickup system mentioned above, the longer the exposure time becomes, the more of a dark current component of electric charge is accumulated in each photoelectric conversion cell, and therefore, the narrower the dynamic range becomes. In addition, since the degree of the dark current is dispersed among photoelectric conversion cells, a two-dimensional unevenness appears in an image obtained in the case of a long time exposure. Furthermore, since the incident light is very weak in the case of a strong time exposure, a signal charge generated by the incident light is buried in the electric charge due to the dark current, with a result that it is no longer correctable.

Another significant problem in the case of a long time exposure is increase of an increased possibility that the solid image pickup device will be exposed to an instantaneous intense light. In the conventional solid state image pickup system, when the amount of incident light reaches a predetermined level, the conventional solid state image pickup device is read out. Therefore, in the case that an instantaneous intense incident light is injected to the solid state image pickup device, an incident light inputted to the solid state image pickup device not only before the instantaneous intense incident light is injected but also when and after the instantaneous intense incident light is injected is detected by the solid state image pickup device until the total amount of light incident to the solid state image pickup device reaches a predetermined level. Therefore, the conventional solid state image pickup system has not been free from influence of the instantaneous intense incident light.

SUMMARY OF THE INVENTION

Accordingly, it is an object of the present invention to provide a solid state image pickup system which has overcome the above mentioned defects present in conventional devices.

Another object of the present invention is to provide a solid state image pickup system capable of removing influence due to the dark current in the case of a long time exposure.

A further object of the present invention is to provide a solid state image pickup system capable of removing influence due to an instantaneous intense incident light.

The above and other objects of the present invention are achieved in accordance with the present invention by a solid state image pickup system comprising:

a solid state image pickup device including a number of photoelectric conversion cells arranged in the form of a matrix having a plurality of rows and a plurality of columns, a plurality of vertical transfer serial shift registers each provided with one corresponding column of photoelectric conversion cells said vertical transfer serial shift registers being to all photoelectric conversion cells of the one corresponding column in parallel, a first horizontal transfer serial shift register coupled to respective first stages of the vertical transfer serial shift registers in parallel, a second horizontal transfer serial shift register coupled to respective final stages of the vertical transfer serial shift registers in parallel, an input section having an output connected to a first stage of the first horizontal transfer serial shift register and an input connected to receive an input signal so as to supply the input signal to the first stage of the first horizontal transfer serial shift register in the form of an electric charge, and an output section having an input connected to a final stage of the second horizontal transfer serial shift register so as to receive an electric charge signal outputted from the final stage of the second horizontal transfer serial shift register and having an output for generating an output signal corresponding to the received electric charge signal;

a feedback path formed between the output of the output section and the input of the input section for feeding the output signal from the output section back to the input section as the input signal;

a pulse generator for outputting timing pulses to the plurality of vertical transfer serial shift registers, the first horizontal transfer serial shift register, the second horizontal transfer serial shift register, the input section and the output section, respectively so that a signal electric charge generated by each photoelectric conversion cell is added to an electric charge which is fed back through the feedback path and which is accumulated in a corresponding stage of the plurality of vertical transfer serial shift registers; and means provided in the feedback path for subtracting from the output signal outputted from the output section a component corresponding to a dark current of a corresponding photoelectric conversion cell as to output the subtracted signal to the input section as the input signal.

Preferably, the solid state image pickup device includes a drain region formed adjacent to each of the photoelectric conversion cells, and the solid state image pickup system further includes a sensor for monitoring the exposure per unitary time, and means coupled to receive a monitor signal from the sensor for outputting a control signal to the the solid state image pickup device so that when a large amount of exposure is detected by the sensor, a signal electric charge generated by each photoelectric conversion cell is discharged to the drain without being transferred to the corresponding stage of the plurality of vertical transfer serial shift registers.

The above and other objects, features and advantages of the present invention, will be apparent from the following description of preferred embodiments of the invention with reference to the accompanying drawings.

BRIEF DESCRIPTION OF THE DRAWINGS

FIG. 3 is a block diagram of one embodiment of the solid state image pickup system in accordance with the present invention;

DESCRIPTION OF THE PREFERRED EMBODIMENTS

Figure 1:
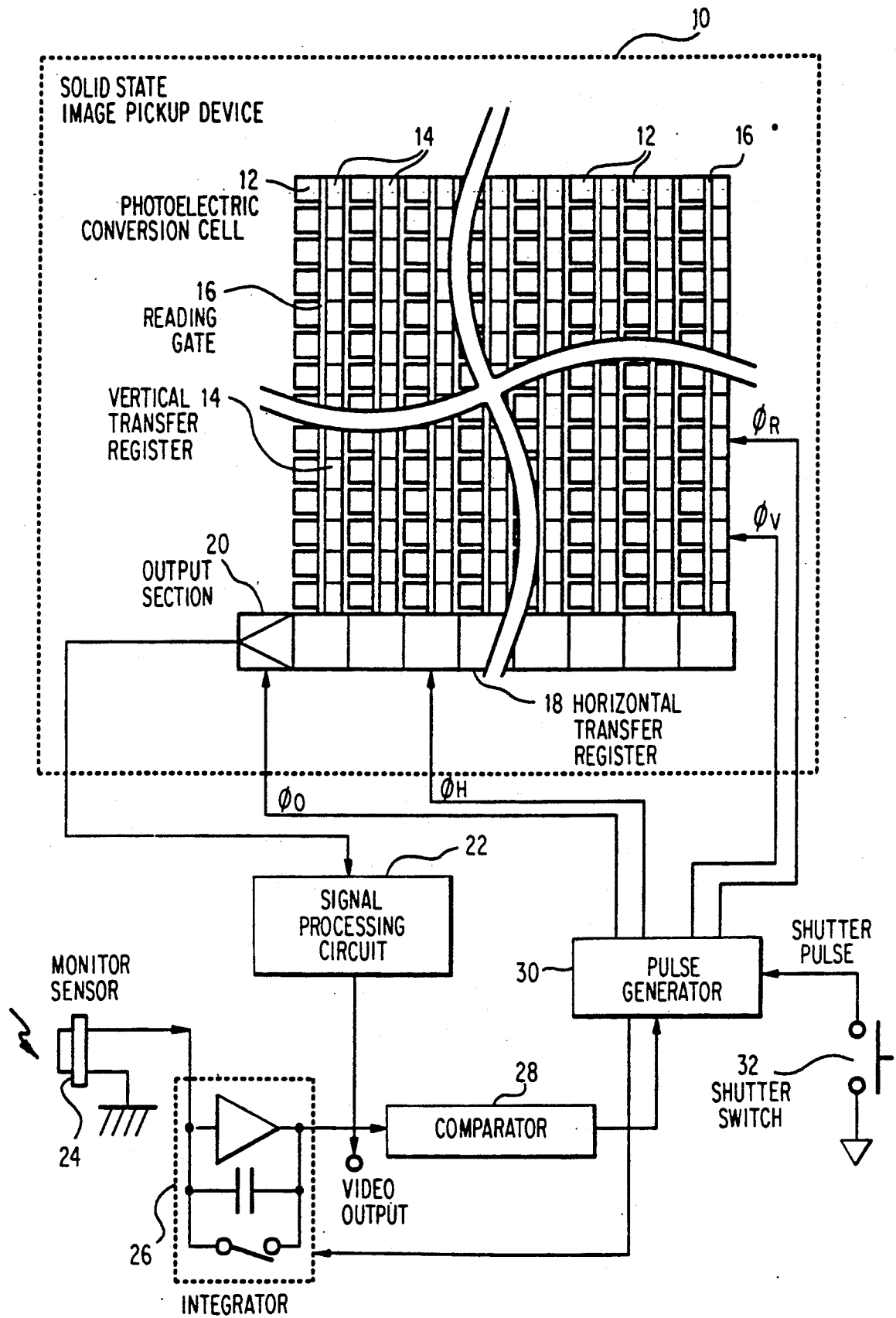
FIG. 1 is a block diagram of a conventional solid state image pickup system.

Referring to FIG. 1, there is shown a block diagram of a conventional solid state image pickup system which is used as a stationary image camera which incorporates therein an interline type solid state image pickup device.

The shown solid state image pickup system includes a solid state image pickup device 10 including a number of photoelectric conversion cells 12 arranged in the form of a matrix having a plurality of rows and a plurality of columns, and a plurality of vertical transfer serial shift register 14 each formed adjacent to one corresponding column of photoelectric conversion cells to receive signal charges from all photoelectric conversion cells of the one corresponding column of photoelectric conversion cells in parallel through an associated reading gate 16. A horizontal transfer serial shift register 18 is coupled to respective final stages of the vertical transfer serial register 14 in parallel, and an input of an output section 20 is connected to a final stage of the horizontal transfer serial shift register 18 so as to receive an electric charge signal outputted from the final stage of the horizontal transfer serial shift register. The output section 20 operates to generate at its output an electric signal corresponding to the received electric charge signal. The electric signal is supplied to a signal processing circuit 22, which processes the received signal so as to generate a video signal.

The shown solid state image pickup system also includes a monitor sensor 24 for detecting a lightness of an image picked up by the solid state image pickup device 10, and an integrator 26 connected to receive a lightness signal outputted from the monitor sensor 24 so as to integrate the lightness signal and generate a total light amount signal. The total light amount signal outputted from the integrator 26 is supplied to a comparator 28 where the total light amount signal is compared with a reference level. When the total light amount signal reaches the reference level, the comparator 28 outputs an exposure control signal to a pulse generator 30. In response to the exposure control signal, the pulse generator 30 outputs a reading pulse $\phi R$, a vertical transfer pulse $\phi V$, a horizontal transfer pulse $\phi H$ and an output section transfer pulse $\phi O$ to the solid state image pickup device 10, respectively.

This pulse generator 30 is also connected to a shutter switch 32 so as to receive a trigger signal generated by the shutter switch 32 when a shutter button (not shown) is depressed. In response to the signal generated by the shutter switch 32, the pulse generator 30 supplies a reset pulse to the integrator 26 to cause to reset the integrator 26.

Figure 2:
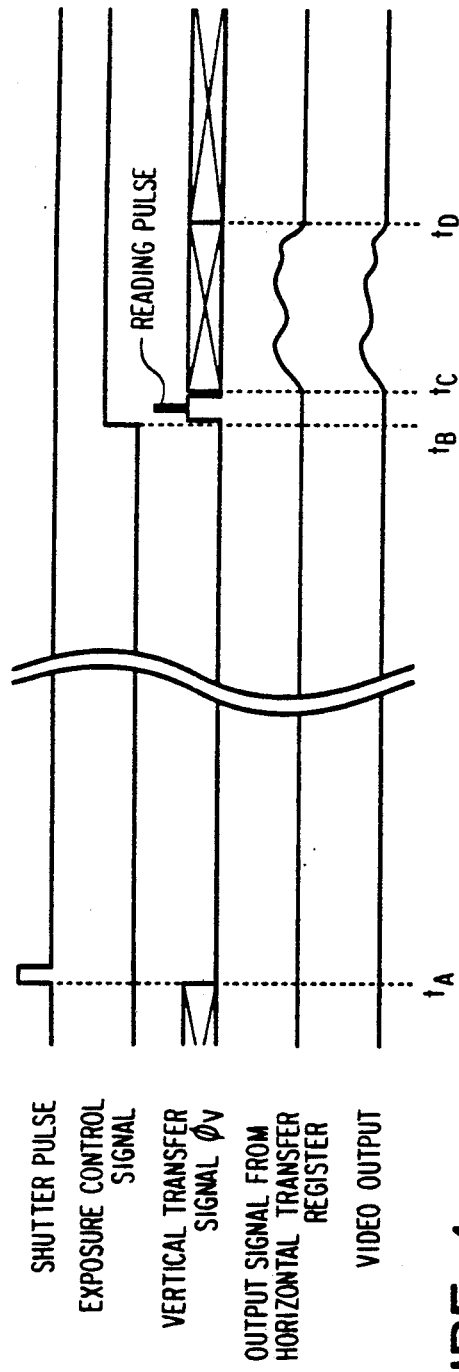
FIG. 2 is a timing chart illustrating an operation of the solid state image pickup system shown in FIG. 1.

Turning to FIG. 2, there is shown a timing chart illustrating an operation of the solid state image pickup system shown in FIG. 1.

If the shutter switch 32 is closed at a time $t_A$ in response to depression of the shutter button, a shutter pulse generated by a closure of the shutter switch 32 is inputted to the pulse generator 30, which in turn operates to reset the integrator 26 so that an integrating capacitor is discharged so as to newly start to integrate the output of the monitor sensor 24 for an exposure control. On the other hand, since a shutter (not shown) is opened in response to the depression of the shutter button, all the photoelectric conversion cells 12 of the solid state image pickup device 10 start to accumulate signal electric charges, respectively. When some time of period has elapsed and the output of the generator 26 reaches a reference level, the exposure control signal is outputted from the comparator 28 to the pulse generator 30 at a time $t_b$, since a rated or predetermined amount of light is deemed to have been injected to the solid state image pickup device 10. In response to the exposure control signal, the pulse generator 30 first generates the reading pulse $\phi R$ to the reading gates 16 of the solid state image pickup device 10 so that the signal electric charge accumulated in each photoelectric conversion cell 12 is transferred to a corresponding stage of the associated vertical transfer serial shift register 14 through the reading gate 16 within a period from the time $t_B$ to a time $t_C$. Then, one vertical transfer pulse $\phi_V$ is applied to all the vertical transfer registers 14 of the solid state image pickup device 10, so that contents of all the vertical transfer registers 14 are shifted towards the horizontal transfer register 18. Namely, contents of the final stages of all the vertical transfer registers 14 are transferred to the horizontal transfer register 18 in parallel, and contents of penultimate stages of all the vertical transfer registers 14 are shifted to the final stages of all the vertical transfer registers 14. The content of the horizontal transfer register 18 is sequentially shifted in response to each horizontal transfer pulse $\phi_H$, and outputted through the output section 20 in response to the output drive pulses $\phi_O$.

After all the content of the horizontal transfer register 18 is exhausted, one vertical transfer pulse $\phi_V$ is applied again to all the vertical transfer registers 14 of the solid state image pickup device 10, so that contents of all the vertical transfer registers 14 are shifted and the contents of the final stages of all the vertical transfer registers 14 are transferred to the horizontal transfer register 18 in parallel. Thereafter, the content of the horizontal transfer register 18 is sequentially shifted in response to each horizontal transfer pulse $\phi_H$, and outputted through the output section 20 in response to the output drive pulses $\phi_O$.

The above mentioned operation is repeated for a period of time from the time $t_C$ to a time $t_D$, all the signal charges transferred from the photoelectric conversion cells 12 to the vertical transfer registers 14 are serially outputted from to the vertical transfer registers 14 through the horizontal transfer register 18 and the output section 20 to the signal processing circuit 22 for the period of time $t_C$ to $t_D$. As a result, the signal processing circuit 22 operates to process the received serial signal and output the video signal.

In the solid state image pickup system as shown in FIG. 1 and mentioned above, the longer the exposure time becomes, the more an of a dark current component of electric charge is accumulated in each photoelectric conversion cell 12, and therefore, the narrower the dynamic range (determined by a capacitance of the photoelectric conversion cell 12 or a capacitance of the vertical transfer register 14) becomes. In addition, the degree of the dark current is different or dispersed in photoelectric conversion cells, and therefore, in the case of a long time exposure, a two-dimensional unevenness appears in an image obtained. In other words, the quality of the image obtained is remarkably deteriorated. Furthermore, since the incident light is very weak in the case of a long time exposure, a signal charge generated by the incident light is buried in an electric charge due to the dark current, with a result that it is no longer possible to make correction.

Another significant problem in the case of a long time exposure is an increased possibility that the solid state image pickup device is exposed to an instantaneous intense light. The instantaneous intense incident light is not a signal light, and therefore, it is desired that a signal corresponding to the instantaneous intense incident light is not outputted from the image pickup device. However, since the conventional image pickup system is such that the output of the monitor sensor 24 is integrated and exposure is controlled on the basis of the integrated value, it has been not possible to completely remove influence due to disturbance light such as the instantaneous intense incident light. In other words, an incident light inputted to the solid state image pickup device 10 not only before the instantaneous intense incident light is injected to the solid state image pickup device 10 but also when and after the instantaneous intense incident light is injected to the solid state image pickup device 10, is photoelectrially converted by the solid state image pickup device 10 until the output of the integrator 26 reaches the predetermined level so that the pulse generator 20 causes the solid state image pickup device 10 to output the light detection charge signal.

In addition, the conventional solid state image pickup system, since the photoelectric conversion cells 12 and the monitor sensor 24 are different in photosensitivity and in saturation property, the control based on the output of the monitor sensor is not so accurate. This inclination is more remarkable in the case that the instantaneous intense incident light is injected.

Referring to FIG. 3, there is shown a block diagram of one embodiment of the solid state image pickup system in accordance with the present invention. In FIG. 3, elements corresponding or similar to those shown in FIG. 1 are given the same Reference Numerals, and explanation thereof will be omitted for simplification of description.

As seen from comparison between FIGS. 1 and 3, a solid state image pickup device 40 shown in FIG. 3 comprises not only the elements 12 to 20 included in the solid state image pickup device 10 shown in FIG. 1, and another horizontal transfer serial shift register 42 coupled in parallel to respective first stages of all the vertical transfer serial shift registers 14. A first stage of the horizontal transfer serial shift register 42 has an input connected to an output of an input section 44.

In addition, the output of the output section 20 of the solid state image pickup device 40 is connected to a comparator 46 and a common terminal of a switch 48. When the switch 48 is in a first connection condition, the switch 48 operates to connect the common input terminal to a first selection terminal connected to a non-inverting input of a differential amplifier 50. An inverting input of the differential amplifier 50 is connected to a memory 52 which stores charge component signals due to dark currents, one for each of the photoelectric conversion cells 12. Therefore, the differential amplifier 50 outputs a corrected light detection signal obtained by subtracting a dark current charge component from the signal outputted from the output section 20 of the solid state image pickup device 40. The corrected light detection signal is fed back to the input section 44 of the solid state image pickup device 40. On the other hand, when the switch 48 is in a second connection condition, the switch 48 operates to connect the common input terminal to a second selection terminal connected to a signal processing circuit 22.

An output of the comparator 46 and a shutter pulse from a shutter switch 32 are supplied to a pulse generator 54. In addition, an output of the monitor sensor 24 is connected through an buffer amplifier 56 to the pulse generator 54. On the other hand, the pulse generator 54 generates not only timing pulses $\phi_R$, $\phi_V$, $\phi_{H2}$ and $\phi_O$ corresponding to the timing pulses $\phi_R$, $\phi_V$, $\phi_H$ and $\phi_O$ generated by the pulse generator 30 shown in FIG. 1, respectively, but also a horizontal transfer pulse $\phi_{H1}$ to supplied to the Horizontal transfer serial shift register 42 and an input drive pulse $\phi_I$ supplied to the input section 44 of the horizontal transfer serial shift register 42. Further, the pulse generator 54 generates a switch control signal to the switch 48.

Figure 4:
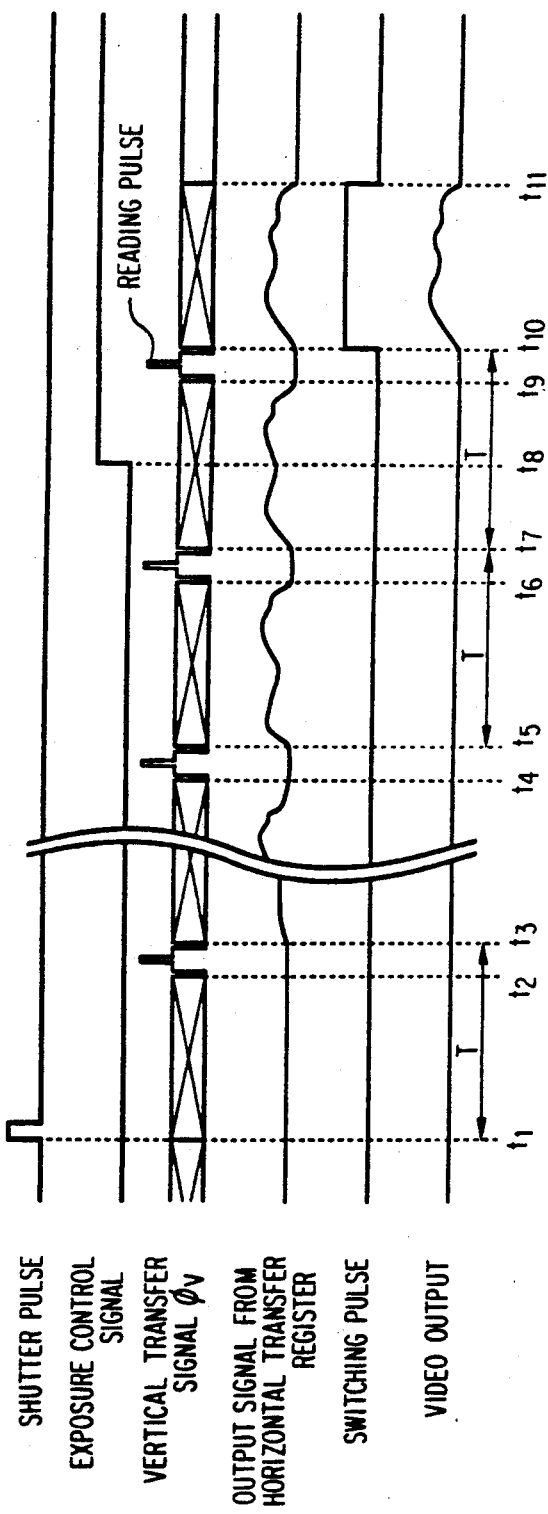
FIG. 4 is a timing chart illustrating an operation of the solid state image pickup system shown in FIG. 3.

Now, an operation of the solid stage image pickup system shown in FIG. 3 will be described with reference to FIG. 4 illustrating operation timings of various portions of the solid state image pickup system shown in FIG. 3.

Assume that the switch 48 is in the first connection condition. When the shutter switch 32 is closed, the shutter pulse is generated to the pulse generator 54, and on the other hand, the solid state image pickup device 40 starts its photoelectric conversion at a time $t_1$. Thereafter, at a time $t_2$, an electric charge in each of the photoelectric conversion cells 12 is read out and transferred to a corresponding stage of the associated vertical transfer 14 is response to the reading pulse $\phi_R$ generated by the pulse generator 54. The vertical transfer registers 14 start at a time $t_3$ sequentially transfer their stored electric charges to the horizontal transfer register 18 in response to each vertical transfer pulse $\phi_V$.

More specifically, after the vertical transfer registers 14 are serially shifted one stage, namely, after the horizontal transfer register 18 has received the electric charges corresponding to one horizontal line, the electric charges corresponding to one horizontal line are serially shifted in the horizontal transfer register 18 in response to each horizontal transfer pulse $\phi_{H2}$ and and sequentially transferred to the output section 20. In response to the output drive pulse $\phi_O$, the output section 20 sequentially and serially outputs the signals indicative of the photodetected charges which are supplied through the switch 48 to the differential amplifier 50, The output signal for each photoelectric conversion cell 12 is subtracted by a dark current charge component signal for a corresponding photoelectric conversion cell which is sequentially outputted from the memory 52 in synchronism with the signal outputted from the output section 20 of the solid state image pickup device 40. The subtracted or corrected signal is fed back to the input section 44 of the solid state image pickup device 40, where the signal is converted to a signal charge, which is sequentially transferred to the horizontal transfer register 42 in response to the input drive signal $\phi_I$, and serially shifted within the horizontal transfer register 42 in response to the horizontal transfer pulse $\phi_{H1}$. After the corrected signal charges corresponding to one horizontal line have been transferred to the horizontal transfer register 42, the corrected signal charges corresponding to one horizontal line are transferred from the horizontal transfer register 42 to the first stages of all the vertical transfer registers 14 in response to the vertical transfer pulse $\phi_V$. At the same time, signal charges corresponding to a next horizontal line are transferred to the final stages of all the vertical transfer registers 14 to the horizontal transfer register 18.

The above mentioned operation is repeated for each vertical transfer pulse $\phi_V$. When the signal charges corresponding to one frame have been processed in the above mentioned manner, namely, at a time $t_4$, each stage of each vertical transfer register 14 stores an electric charge obtained by subtracting a dark current charge component from the signal charge previously read out from the same stage of the same vertical transfer register 14

Therefore, the reading pulse $\phi_R$ is generated again at a time $t_4$, so that the electric charge accumulated in each of the photoelectric conversion cells 12 is read out again and transferred to the corresponding stage of the associated vertical transfer register 14. As a result, the newly read-out electric charge is added to the corrected signal charge stored in the corresponding stage of the associated vertical transfer register 14. Each electric charge composed of the newly read-out electric charge and the corrected signal charge is fed from the vertical transfer register 14 through the horizontal transfer register 18, the output section 20, the switch 48, the differential amplifier 50, the input section 44 and the horizontal transfer register 42 and back to the same vertical transfer register 14, in the above mentioned manner. In this process, a dark current charge (an electric charge accumulated in each photoelectric conversion cell for one period T between a pair of adjacent photoelectric conversion cell readings) is subtracted from the feedback electric charge.

The above mentioned process in which the electric charge accumulated in each of the photoelectric conversion cells 12 is read out and added to the corrected signal charge stored in the corresponding stage of the associated vertical transfer register 14, and returned to the corresponding stage of the associated vertical transfer register 14 after the dark current charge component is subtracted from the signal charge, is repeatedly executed with the period T. As a result, the output signal from the output section 20 of the solid state image pickup device 40 gradually increases, as shown in FIG. 4. The output signal from the output section 20 is ceaselessly monitored by the comparator 46, and when the output signal from the output section 20 exceeds a predetermined reference level (at a time $t_8$), the comparator 46 generates an exposure control signal to the pulse generator 54. In response to the exposure control signal, the pulse generator 54 generates a final reading pulse $\phi_R$ to the solid state image pickup device 40 at a time $t_9$. Thereafter, at a time $t_{10}$, the pulse generator 54 outputs the switch control signal to the switch 48 to cause the switch 48 to switch from the first connection condition to the second connection condition, so that the output signal from the output section of the solid state image pickup device 40 is supplied to the signal processing circuit 22, and on the other hand, the pulse generator 54 generates the transfer pulses and the output drive pulse required for reading out photo-detection signals corresponding to one frame. As a result, the signal processing circuit 22 generates a video signal for one frame of stationary image.

As seen from the above, in the solid state image pickup system as mentioned above and shown in FIG. 3, an electric charge corresponding to a dark current in subtracted or removed, at an appropriate intervals, from the electric charge detected by each photoelectric conversion cell and accumulated in a corresponding stage of the vertical transfer register. Therefore, even in the case of a long time exposure, the charge due to the dark current will not be increased.

However, if an instantaneous intense light is injected to the solid state image pickup device 40 before the time $t_{10}$ in FIG. 4, the output signal of the solid state image pickup device 40 becomes instantaneously very strong, and therefore, the exposure control becomes inaccurate. In order to prevent the exposure control from becoming inaccurate, the monitor sensor 24 is located near to or a peripheral portion of the solid state image pickup device 40, and when the monitor sensor detects an instantaneous intense light, the photoelectric conversion cell reading to be executed after the monitor sensor has detected an instantaneous intense light is not executed by closing the reading gate 16, so as to prevent the the electric charge in each photoelectric conversion cell including the electric charge corresponding to the instantaneous intense light from being mixed to the electric charge stored in the corresponding stage of the vertical transfer register. With this, a video signal which is not influenced by the instantaneous intense light can be obtained.

Alternatively, the influence of the instantaneous intense light can be removed or avoided in the following means. Namely, the solid state image pickup device has an overflow drain structure as shown in FIGS. 5A and 5B.

Figure 5A:
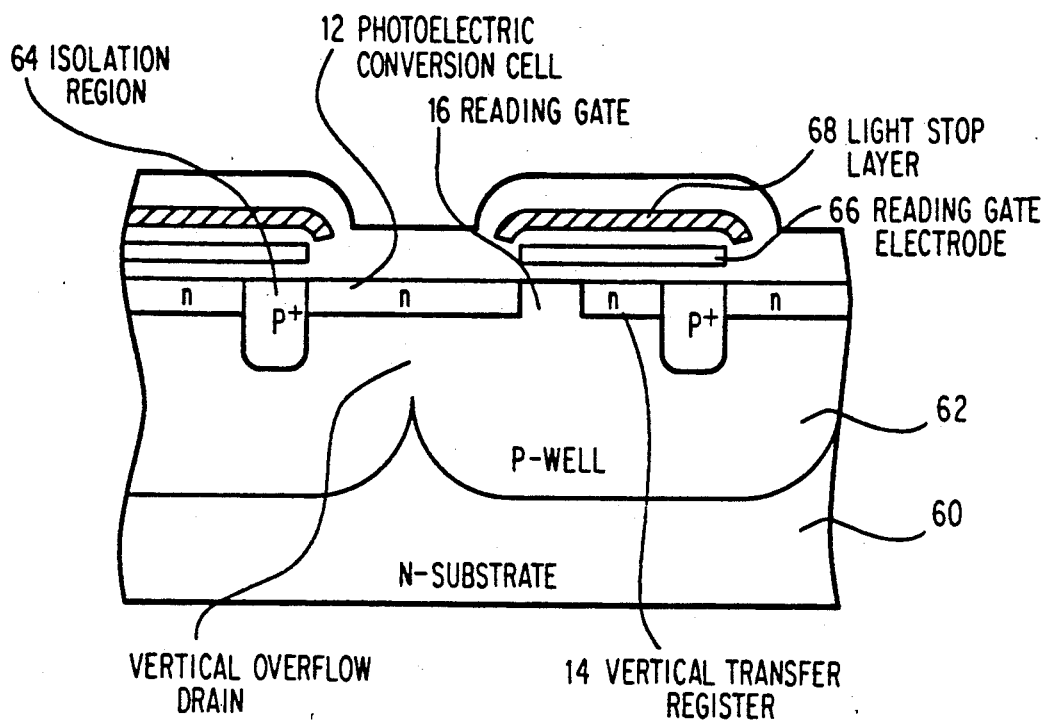
FIGS. 5A and 5B are diagrammatic sectional views of the solid state image pickup device having an overflow drain structure.

FIG. 5A shows a vertical overflow drain structure. In FIG. 5A, Reference Numeral 60 indicates an N-type substrate having a plurality of P-wells 62. In each of the P-well 62 there are formed a photoelectric conversion cell 12 in the form of a photodiode, a reading gate 16, a vertical transfer 14, and an isolation region (channel stop) 64, as shown. In addition, a reading gate electrode 66 is formed to extend over the reading gate 16, the vertical transfer register 14, and the channel stop 64, and a light stop layer 68 is formed to cover the reading gate electrode 66 as shown. In this structure, the photoelectric conversion cell 12, the P-well 62 and the N-substrate form a vertical overflow drain structure of a NPN type.

Figure 5B:
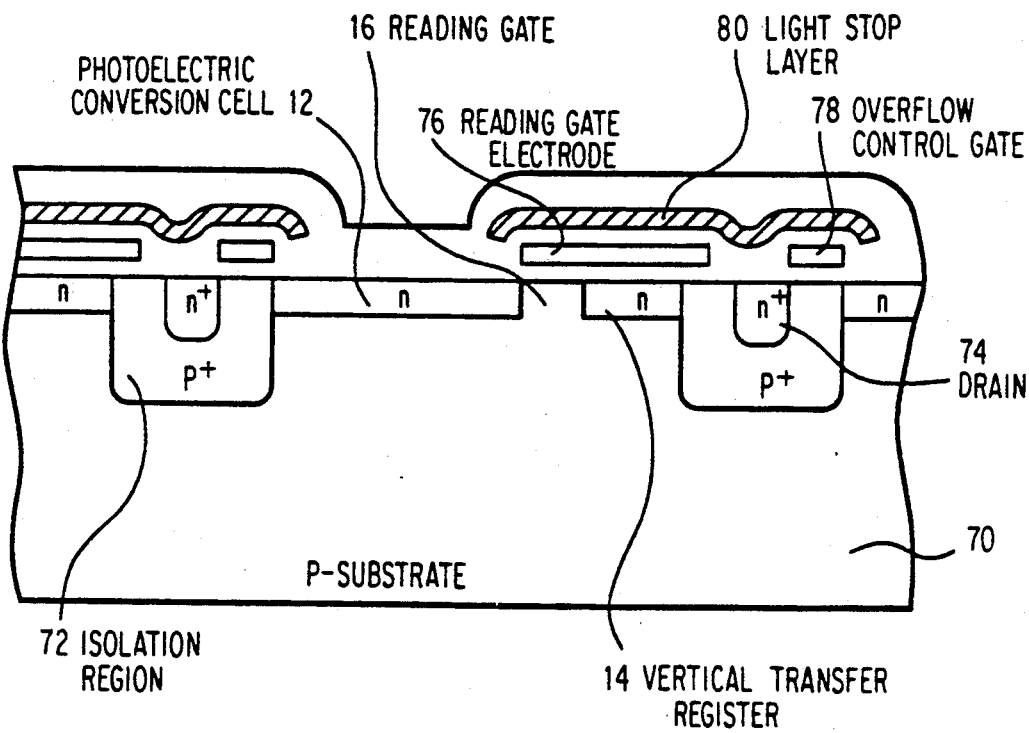

On the other hand, FIG. 5B shows a lateral overflow drain structure. In FIG. 5B, Reference Numeral 70 indicates an P-type substrate. In the P-substrate 70 there are formed a photoelectric conversion cell 12 in the form of a photodiode, a reading gate 16, a vertical transfer register 14, and an isolation region (channel stop) 72, as shown. The channel stop 72 has a drain 74 formed therein. In addition, a reading gate electrode 76 is formed to extend over the reading gate 16, the vertical transfer register 14, and one side portion of the channel stop 72 excluding the drain 74, and a overflow control gate 78 is formed to extend over the other side portion of the channel stop 72 excluding the drain 74. A light stop layer 80 is formed to cover the reading gate electrode 76 and the overflow control gate 78 as shown. In this structure, the photoelectric conversion cell 12, the channel stop 72, the drain 74 and the overflow control gate 78 form a lateral overflow drain structure.

In the above mentioned overflow drain structure, when the instantaneous intense light is detected by the monitor sensor 24, electric charges stored in all the photoelectric conversion cells and corresponding to a field subjected to the instantaneous intense light are completely discharged by applying a pulse to the N-substrate 60 in the case of the vertical overflow drain structure, and to the overflow control gate 78 in the case of the lateral overflow drain structure. Thereafter, an ordinary image pickup operation is executed again.

Thus, a long time exposure can be realized without interrupting of the image pickup operation within one shutter period and without being influenced by an instantaneous intense light.

The invention has thus been shown and described with reference to the specific embodiments. However, it should be noted that the present invention is in no way limited to the details of the illustrated structures but changes and modifications may be made within the scope of the appended claims.

I claim:

1. A solid state image pickup system comprising:
   a solid state image pickup device including a number of photoelectric conversion cells arranged in the from of a matrix having plurality of rows and a plurality of columns, a plurality of vertical transfer serial shift registers, each provided with one corresponding column of photoelectric conversion cells, said vertical transfer serial shift registers being coupled to all photoelectric conversion cells of said one corresponding column in parallel, a first horizontal transfer serial shift register coupled to respective first stages of said vertical transfer serial shift registers in parallel, a second horizontal transfer serial shift register couple to respective final stages of said vertical transfer serial shift registers in parallel, an input section having an output connected to a first stage of said first horizontal transfer serial shift register and an input connected to receive an input signal so as to supply the received input signal to said stage of said first horizontal transfer serial shift register in the form of an electric charge, and an output section having an input connected to a final stage of said second horizontal transfer serial shift register so as to receive an electric charge signal outputted from said final stage of said second horizontal transfer serial shift register and having an output for generating an output signal corresponding to the received electric charge signal;
   a feedback path formed between said output of said output section and said input of said input section for feeding said output signal from said output section back to said input section as said input signal;
   a pulse generator for outputting timing pulses to said plurality of vertical transfer serial shift registers, said first horizontal transfer serial shift register, said second horizontal transfer serial shift register, said input section and said output section, respectively so that a signal electric charge generated by each photoelectric conversion cell is added to an electric charge which is fed back through said feedback path and which is accumulated in a corresponding state of said plurality of vertical transfer serial shift registers; and
   means provided in said feedback path for subtracting from said output signal outputted from said output section a component corresponding to a dark current of a corresponding photoelectric conversion cell so as to output the subtracted signal to said input section as said input signal.

2. A system claimed in claim 1 wherein said solid state image pickup device includes a drain region formed adjacent to each of said photoelectric conversion cells, and further including a sensor for monitoring the exposure per unitary time, and means coupled to receive a monitor signal from said sensor for outputting a control signal to said solid state image pickup device so that when a large amount of exposure is detected be said sensor, a signal electric charge generated by each photoelectric conversion cell is discharged to said drain region without being transferred to the corresponding stage of said plurality of vertical transfer serial shift registers.

3. A solid state image pickup system comprising:
   a solid state image pickup device including a number of photoelectric conversion cells arranged in the form of a matrix having a plurality of rows and a plurality of columns, a plurality of vertical transfer serial shift registers, each provided with one corresponding column of photoelectric conversion cells, said vertical transfer serial shift registers being coupled to all photoelectric conversion cells of said one corresponding column in parallel, a first horizontal transfer serial shift register coupled to respective first stages of said vertical transfer serial shift registers in parallel, a second horizontal transfer serial shift register coupled to respective final stages of said vertical transfer serial shift registers in parallel, an input section having an output connected to a first stage of said first horizontal transfer serial shift register, and an output section having an input connected to a final stage of said second horizontal transfer serial shift register;
   a feedback path formed between an output of said output section and an input of said input section;
   an pulse generator for generating timing pulses to said plurality of vertical transfer serial shift registers, said first and second horizontal transfer serial shift registers, said input section and said output section, respectively so that a signal electric charge which is fed back through said feedback path and which is accumulated in a corresponding stage of said plurality of vertical transfer serial shift registers; and
   a circuit provided in said feedback path for subtracting from said output signal outputted from said output section a component corresponding to a dark current of a corresponding photoelectric conversion cell so as to output the subtracted signal to said input section.

4. A solid state image pickup system comprising:

a solid state image pickup device including a number of photoelectric conversion cells arranged in the form of a matrix having a plurality of rows and a plurality of columns, a plurality of vertical transfer serial shift registers, each provided with one corresponding column of photoelectric conversion cells, said vertical transfer serial shift registers being coupled to all photoelectric conversion cells of said one corresponding column in parallel, a first horizontal transfer serial shift register coupled to respective first stages of said vertical transfer serial shift registers in parallel, a second horizontal transfer serial shift register coupled to respective final stages of said vertical transfer serial shift registers in parallel, an input section having an output connect to a first stage of said first horizontal transfer serial shift register, and an output section having an input connected to a final stage of said second horizontal transfer serial shift register;

a feedback path formed between an output of said output section an dan input of said input section;

a pulse generator for generating timing pulses to said plurality of vertical transfer serial shift registers, said first and second horizontal transfer serial shift registers, said input section and said output section, respectively so that a signal electric charge generated by each photoelectric conversion cell is added to an electric charge which is fed back through said feedback path and which is accumulated in a corresponding stage of said plurality of vertical transfer serial shift registers;

a sensor for monitoring the exposure per unitary time; and means coupled to receive a monitor signal from said sensor for outputting a control signal to said solid state image pickup device so that when a large amount of exposure is detected by said sensor, a signal electric charge generated by each photoelectric conversion cell is discharged without being transferred to the corresponding stage of said plurality of vertical transfer serial shift registers.

* * * * *

UNITED STATES PATENT AND TRADEMARK OFFICE
CERTIFICATE OF CORRECTION

PATENT NO. : 5,053,873
DATED : October 1, 1991
INVENTOR(S) : Yukio Taniji

It is certified that error appears in the above-identified patent and that said Letters Patent is hereby corrected as shown below:

Col. 2, line 23, after "being" insert --coupled--;

Col. 2, line 59, after "cell" insert --so--;

Col. 3, line 68, delete "φR" and insert --$\phi_R$--;

Col. 4, line 1, delete "φV" and insert --$\phi_V$--;

Col. 4, line 1, delete "φH" and insert --$\phi_H$--;

Col. 4, line 2, delete "φO" and insert --$\phi_O$--;

Col. 4, line 26, delete "generator" and insert therefor --integrator--;

Col. 4, line 33, delete "φR" and insert --$\phi_R$--.

Signed and Sealed this

Twenty-fifth Day of May, 1993

Attest:

MICHAEL K. KIRK

*Attesting Officer*  *Acting Commissioner of Patents and Trademarks*